US006646469B2

United States Patent
Yushan

(10) Patent No.: US 6,646,469 B2
(45) Date of Patent: Nov. 11, 2003

(54) HIGH VOLTAGE LEVEL SHIFTER VIA CAPACITORS

(75) Inventor: Li Yushan, Longmont, CO (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/014,235

(22) Filed: Dec. 11, 2001

(65) Prior Publication Data

US 2003/0107425 A1 Jun. 12, 2003

(51) Int. Cl.[7] ................................................ H03K 17/16
(52) U.S. Cl. .......................................... 326/83; 326/68
(58) Field of Search ........................ 326/63, 68, 70–74, 326/83, 86

(56) References Cited

U.S. PATENT DOCUMENTS 5,572,156 A * 11/1996 Diazzi et al. ................ 327/109
5,742,196 A * 4/1998 Fronen et al. ............... 327/108
6,353,345 B1 * 3/2002 Yushan et al. ................. 326/80

* cited by examiner

Primary Examiner—Don Le
(74) Attorney, Agent, or Firm—Steven R. Biren

(57) ABSTRACT

A driver circuit is disclosed for driving a half bridge driver or similar circuit. The driving circuit induced transient currents in two passive devices, and utilizes the transient currents to set or reset a latch at appropriate times required to properly drive a half bridge driver or similar type of circuit.

10 Claims, 2 Drawing Sheets

HIGH VOLTAGE LEVEL SHIFTER VIA CAPACITORS

TECHNICAL FIELD

This invention relates to power switches, and more specifically, to an improved technique of providing level shifting required in a floating high side power switch in the half bridge configuration. The invention has specific application in power switches utilizing field effect transistor (FET) devices.

BACKGROUND OF THE INVENTION

A half bridge configuration is utilized in connection with various power switch applications. Such a half bridge configuration typically involves an output signal interposed between two powered FET devices. An example of such prior art arrangement is shown in FIG. 1.

In operation, the output signal $V_{HB}$ may fluctuate from nearly zero volts with respect to ground point 101, up to nearly 400 volts, depending upon the parameters of the amplifying circuit and input power introduced into the circuit.

In order to properly operate transistor $T_1$ in its normal operating region, the gate voltage $G_1$ must be controlled with reference to the output signal $V_{HB}$, not with respect to ground. Therefore, the power voltage $F_{VDD}$ should ideally be the equivalent of the voltage $V_{DD}$ of FIG. 1, except shifted by an amount substantially equal to $V_{HB}$. Additionally, the gateway voltage $G_1$ for transistor $T_1$ should be equal to the appropriate voltage to turn on a transistor (e.g., $G_2$), shifted up by an amount substantially equal to $V_{HB}$.

The circuitry for shifting the power source $F_{VDD}$ is known in the art and not critical to the present invention. Numerous circuits and related arrangements exist for generating such a voltage, and will not be discussed in detail herein. The particular circuitry used to generate the $F_{VDD}$ is not critical to the present invention.

In operation, a non-overlapping circuit 105 generates two non-overlapping pulses 106 and 107. The first pulse 106 is transmitted via a driver 108 to the gate $G_2$ of a power transistor $T_2$. Since the voltage is controlling transistor $T_2$ must be set with respect to a ground voltage, no level shifting is required.

Gate voltage $G_1$ controlling transistor $T_1$ must however, be set with respect to voltage $V_{HB}$. Therefore, the remaining circuitry included within FIG. 1 is directed largely at voltage shifting the pulse 107 to provide the appropriate gate voltage $G_1$ adjusted by the dynamically moving signal $V_{HB}$, which may be anywhere between zero and 400 volts.

In order to obtain the appropriate shift, two fixed current sources 112 and 114 are utilized. When the pulse generator 115 is on a rising edge, current source 114 is on and current source 112 is off. On a falling edge, the reverse happens, current source 112 being on and current source 114 being turned off.

In analysis of the remaining circuitry will show that power devices $M_1$ and $M_2$ each alternatively generate the required current through resistors $M_9$ and $M_{10}$ at the appropriate time in order to either set or reset, as appropriate, latch 116. Therefore, upon rising edges latch 116 sets, and upon falling edges the latch resets. This causes the output of driver 117 to generate the appropriate gate voltage required to control transistor $T_1$. Notably, since both the driver 117 and latch 116 are referenced to $V_{HB}$, and since the supply voltage $F_{VDD}$ is shifted by $V_{HB}$, everything operating with respect to transistor $T_1$ is with reference to $V_{HB}$.

In summary, the circuitry of FIG. 1 operates by utilizing two current sources, a first of which induces a current sufficient to turn on a "set" transistor, and a second of which induces a current to turn on a "reset" transistor. By turning the appropriate current sources on or off at the appropriate times, a latch 116 is set or reset, and a driver 117 is controlled at a voltage that is relative not to ground but to a variable level signal $V_{hb}$. This scenario appropriately drives the transistor $T_1$.

A problem with the circuit of FIG. 1 is that it is lossy. The devices $M_1$ and $M_2$ and current sources 112 and 114 represent lossy devices, which waste relatively large amounts of power, particularly at high frequencies. Additionally, the current sources 112 and 114 are subject to the normal failure that is inherent in such active devices.

Therefore, it is desirable to provide a high power switching arrangement that can be utilized in a half bridge configuration while eliminating the high losses associated with active devices.

It is also desirable that such a circuit has a low manufacturing cost, and that it be more reliable than is presently achievable.

SUMMARY OF THE INVENTION

The above and other problems of the prior art are overcome in accordance with the present invention. Active devices utilized to effectuate the currents required to switch a latch are replaced with passive devices and small drivers. The drivers and passive devices have far less conduction losses than the active high voltage switches and current sources previously utilized.

In one preferred embodiment, the passive devices are capacitors, and the current is induced by a sudden change in voltage induced at one terminal of the capacitor. Since the capacitor has very low impedance at high frequencies, the sudden change in voltage induces a current large enough and for long enough to set or reset the latch as appropriate. Therefore, the capacitor, as a passive device, provides the required current required to set and reset a latch, and thus properly drive a transistor, rather than using an active device.

DETAILED DESCRIPTION OF THE PREFERRED EMBODIMENT

Figure 1:
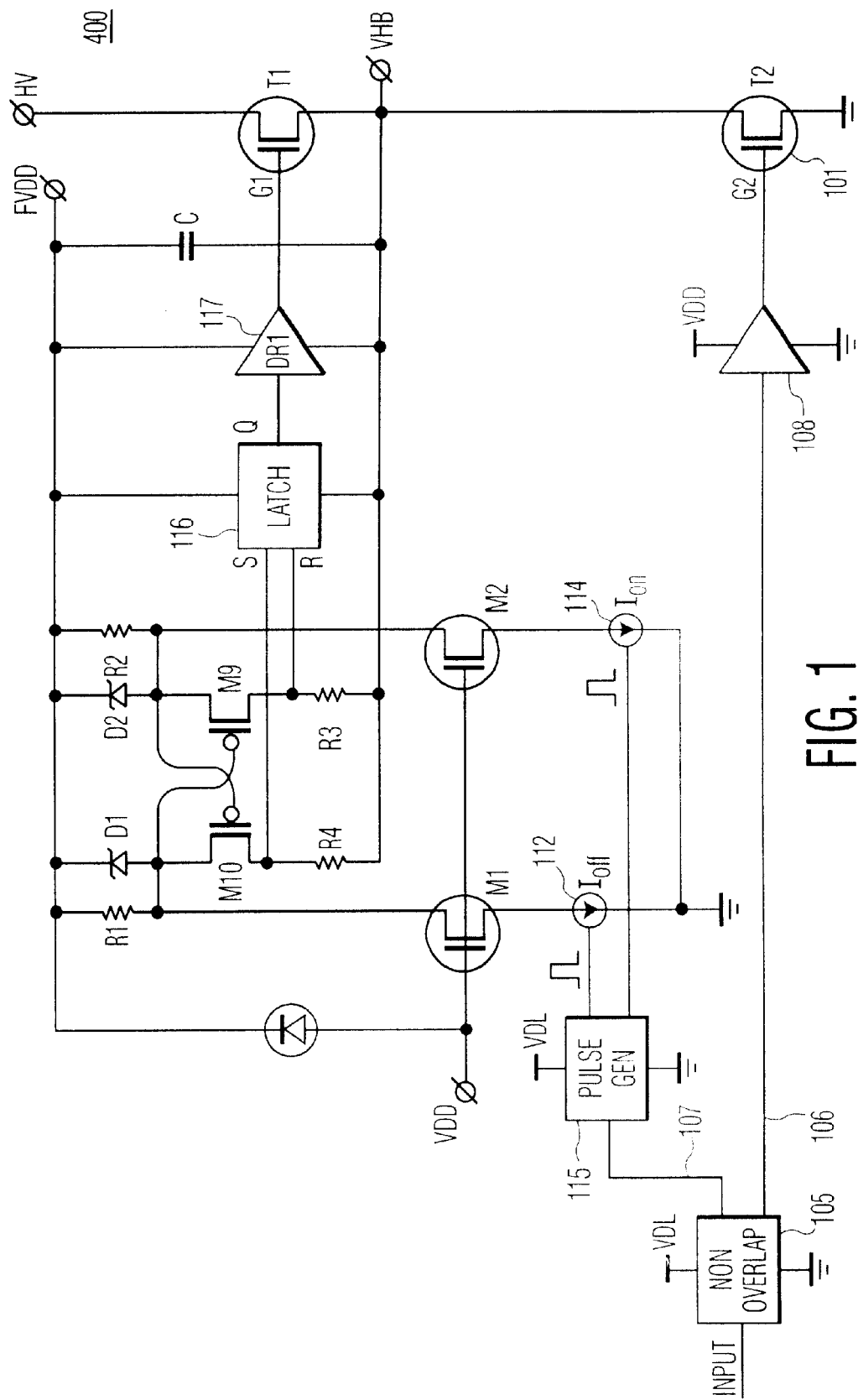
FIG. 1 depicts an amplifying circuit utilizing plural current sources in a prior art type of arrangement.
Figure 2:
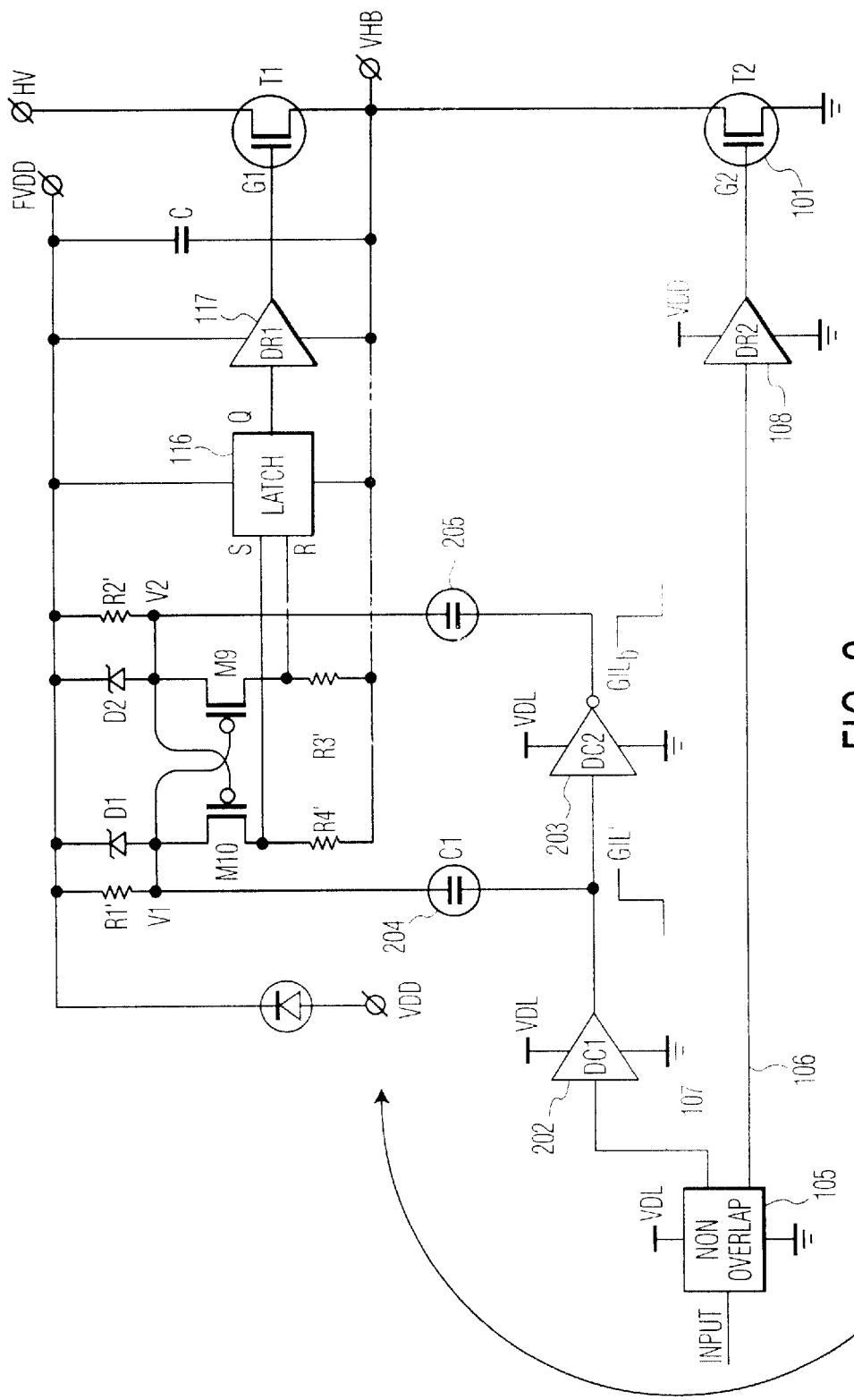
FIG. 2 shows an exemplary embodiment of the invention wherein the current sources are replaced with passive devices, the passive devices being capacitors in the exemplary embodiment.

FIG. 2 shows an exemplary arrangement for implementing inventive techniques. Components of FIG. 2 are similar to those of FIG. 1 or labeled with the same numerals for clarity. The circuit of FIG. 2 also includes two capacitors 204 and 205, and drivers 202 and 203. Exemplary values of capacitors 204 and 205 would be 1 picofarad, for a circuit in which $V_{HB}$ was set at approximately 400 volts. The drivers 202–203 could be of a type commercially available as a discrete component or may be part of an integrated circuit that comprises the entire arrangement shown.

In operation, the rising edge of the pulse signal on line 107 is input to driver 202 and propagates through to inverting driver 203. It can be appreciated that a rising edge will cause a current to be induced into capacitor 205, whereas a falling edge will cause a current to be induced into capacitor 204. Thus, the capacitors serve to induce the required current as a current source would do.

The current flows through resistor $R_1$ and causes the latch 116 to set its output, in a similar manner to that described with respect to the prior art. As a result of the latch 116 setting, driver 117 outputs a high signal into gate 1 of transistor $T_1$. However, since driver 117 is referenced to the same point as $V_{HB}$, the high input on gate $G_1$ of transistor $T_1$ is driven with a voltage relative to $V_{HB}$, rather than relative to ground as is the case for transistor $T_2$. Thus, the voltage of $G_1$ is $V_{HB}$ plus ten volts, where at least four volts is the required turn-on voltage to switch transistor $T_1$ on.

In a similar manner, capacitor 205 induces a current to flow through resistor R2. This current is sufficient to cause an appropriate voltage drop across R2 and to thereby reset the latch 116. Such a resetting causes a turning off of transistor $T_1$ by removal of the gate voltage $G_1$.

In accordance with the invention then, a passive device is utilized to induce current sufficient to cause setting and resetting of a latch. The passive device utilized may include an inductor or other storage device, but in any event, does not require the pulse generation nor does the power of a switching transistor. Instead, the passive device inherently includes a time constant, which is selected sufficiently long can cause the latch to set or reset.

Selection of the devices 204 and 205 must be done in a manner sufficient to meet two separate requirements. First, the current must be sufficient to induce an appropriate voltage drop across $R_1$ or $R_2$, as appropriate, in order to effectuate the setting or resetting of latch 116.

Second, the time constant of the Resistor-Capacitor (R/C) circuit formed by capacitors 204 and 205 in conjunction with resistors $R_1$ and $R_2$, respectively, must allow sufficient time for latch 116 to set or reset, as the case may be. In a typical application, the time required would be approximately forty nanoseconds. If the time constant is sufficiently long, and the capacitors 204 and 205 sufficiently large, then there will be a relatively constant current for the amount of time required to set or reset latch 116 as the case may be. Put another way, the time required to reset the latch 116 should be short relative to the time constant of the R/C circuit, so that the current does not drastically decay before the latch gets reset. This criteria is easy to meet, since a typical value of a time constant using a one picofarad capacitor would be eighty nonoseconds yet the latch can be reset in only forty nanoseconds.

Although the invention has been described with respect to capacitors, any passive device may be used, and the types of transistors may be substituted for the field effect transistors shown as $T_1$ and $T_2$. Various other embodiments will be apparent to those of skill in the art and the above examples are for purposes of explanation only.

What is claimed:

1. A level shifting circuit comprising:

plural passive devices, each device being arranged to induce a transient current at specified predetermined times; and a latch that is connected to said passive devices in a manner such that the induced currents set and reset said latch at appropriate predetermined times;

wherein said plural passive devices comprise at least two capacitors, each capacitor having terminals; and wherein a terminal of a first of said capacitors is connected to a first driver, and a terminal of a second of said capacitors is connected to a second driver, and wherein said first driver outputs a signal that is inverted with respect to said output of said second driver.

2. The circuit of claim 1 further comprising a nonoverlapping generator for generating at least two nonoverlapping periodic waveforms, at least one of which is input to an input of said first driver.

3. The circuit of claim 2 wherein a second of said nonoverlapping waveforms is connected to an amplifying transistor through a driver.

4. The circuit of claim 3 wherein a second terminal of each of said capacitors is connected to both a resistor and an input transistor.

5. The circuit of claim 4 wherein each input transistor has a drain, and wherein said drains are connected to different inputs of said latch, one of said drains being connected to a set input of said latch, and another of said drains being connected to a reset input of said latch.

6. The circuit of claim 5 wherein said latch has an output, and said output is connected to a driver.

7. A method of driving a half bridge driver comprising the steps of:

inducing two transient currents in two passive devices, each of said currents being induced at a different time, and utilizing said induced transient currents to set and reset a latch at prescribed times;

wherein said transient currents are induced by rapidly changing a voltage across a capacitor; and wherein the transient currents are induced via a periodic signal that is input to a first driver, and wherein an output of said first driver is input to a second driver.

8. The method of claim 7 wherein the output of the latch is input to a driver.

9. The method of claim 7 wherein said first driver and said second driver produce signals that are complements of each other.

10. The method of claim 9 further comprising the step of producing nonoverlapping waveforms, one of which is utilized as input to said first driver, and another of which is utilized to drive a transistor.

* * * * *